United States Patent [19]

Hsieh et al.

[11] Patent Number: 5,559,971
[45] Date of Patent: Sep. 24, 1996

[54] FOLDED HIERARCHICAL CROSSPOINT ARRAY

[75] Inventors: Wen-Jai Hsieh; Chi-Song Horng; Chun C. D. Wong, all of Palo Alto, Calif.

[73] Assignee: I-Cube, Inc., Santa Clara, Calif.

[21] Appl. No.: 333,371

[22] Filed: Nov. 2, 1991

Related U.S. Application Data

[63] Continuation-in-part of Ser. No. 171,752, Dec. 21, 1993, Pat. No. 5,426,738, which is a continuation of Ser. No. 785,082, Oct. 30, 1991, abandoned.

[51] Int. Cl.$^6$ ........................ G06F 13/00; H03K 19/0175
[52] U.S. Cl. ............... 395/312; 340/825.85; 340/825.89; 395/311; 326/41
[58] Field of Search .................... 340/825.86, 825.87, 340/825.88, 825.89; 326/41; 370/58; 395/311

[56] References Cited

U.S. PATENT DOCUMENTS

| | | | |
|---|---|---|---|
| 4,068,215 | 1/1978 | Mukaemachi et al. | 340/825.87 |
| 4,670,749 | 6/1987 | Freeman | 340/825.85 |
| 4,745,409 | 5/1988 | Hofmann | 340/825.87 |
| 4,807,184 | 2/1989 | Shelor | 395/311 |
| 4,817,082 | 3/1989 | Orsic | 370/58 |
| 4,973,956 | 11/1990 | Lin et al. | 340/825.86 |
| 5,426,738 | 6/1995 | Hsieh et al. | 307/112 |
| 5,465,056 | 11/1995 | Hsieh et al. | 326/41 |

FOREIGN PATENT DOCUMENTS

| | | |
|---|---|---|
| 61-67318 | 8/1986 | Japan . |
| 2-46758 | 4/1990 | Japan . |

Primary Examiner—Thomas C. Lee
Assistant Examiner—Duo Chen
Attorney, Agent, or Firm—Smith-Hill and Bedell

[57] ABSTRACT

A hierarchical crosspoint array is formed by switch cells occupying separate rectangles in a common plane of an integrated circuit. The switch cells are arranged to form square subarrays which, along with a corresponding set of control cells form a compact square shaped crosspoint array. Each switch cell includes three I/O lines crossing in two orthogonal directions and mating with I/O lines of adjacent switch cells to form two orthogonal arrays of I/O lines. Pairs of orthogonal I/O lines are permanently interconnected where they intersect in switch cells along a main diagonal of the array to provide signal paths leading from separate ports along the edges of the array each extending the length and width of the crosspoint array. Each switch cell of a subarray selectively interconnects two such signal paths to provide a signal path between two ports in response to a combination of states of a bit stored in the switch cell and a bit stored in a control cell corresponding to the subarray. The control signal supplied to each subarray concurrently inhibits switch operation of all cells in the subarray. The crosspoint array can be made to quickly switch buses connected to its ports by changing only the relatively small amount of data stored in the control cells without having to change the relatively large amount of data stored in each switch cell.

10 Claims, 11 Drawing Sheets

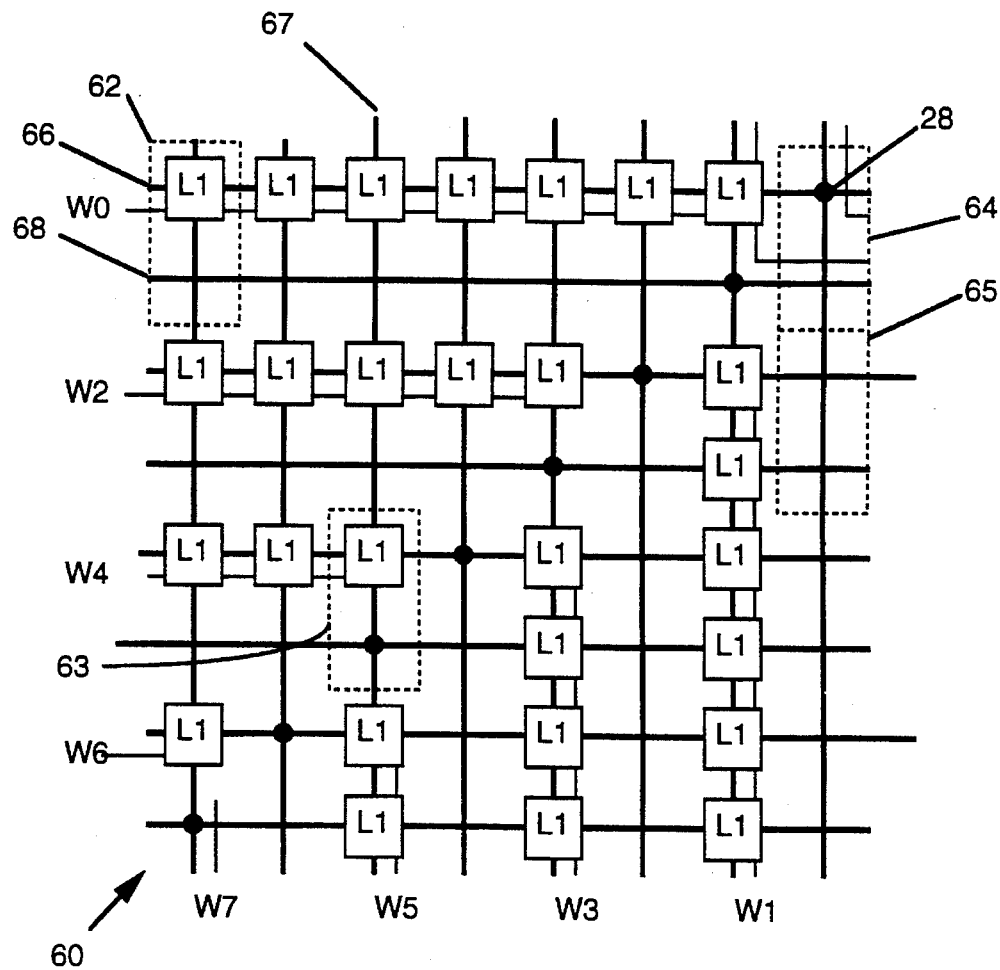
FIG. 5B
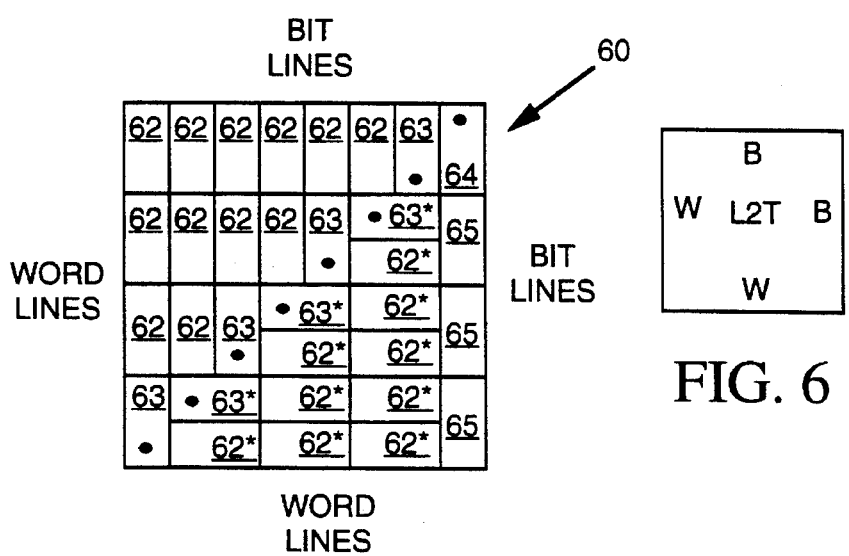
FIG. 5C
FIG. 6

FOLDED HIERARCHICAL CROSSPOINT ARRAY

CROSS-REFERENCE TO RELATED APPLICATIONS

The present application is a continuation-in-part of application Ser. No. 08/171,752, filed Dec. 21, 1993, now U.S. Pat. No. 5,426,738, which is in turn a continuation of application Ser. No. 07/785,082, filed Oct. 30, 1991, now abandoned.

BACKGROUND OF THE INVENTION

1. Field of the Invention

The present invention relates in general to integrated circuit crosspoint arrays and in particular to a crosspoint array having a folded layout and multiple levels of switch control.

2. Description of Related Art

A typical crosspoint array implemented on an integrated circuit has several signal ports and can selectively route signals between its ports. The prior art crosspoint array is made up of switch cells arranged in rows and columns and sets of parallel input/output (I/O) lines running both horizontally and vertically through the switch cells for conveying signals to and from the ports. Each vertical I/O line runs through a separate column of switch cells and each horizontal I/O line runs through a separate row of switch cells such that each switch cell lies at the intersection of one vertical I/O line and one horizontal I/O line. Each switch cell includes a switching element such as a pass transistor for selectively interconnecting the horizontal and vertical I/O lines so that signals may pass therebetween. Each switch cell also includes a single bit memory cell storing a data bit for controlling the state of the switch. External control circuits transmit the data bits to the memory cells of each column through "bit" lines extending through each column of the array. The external control circuits also transmit write enable signals to the memory cells in each row via "word" lines extending along each row of the array.

In a square crosspoint array, each horizontal and each vertical conductor services a separate port, and a switch cell is located at every horizontal and vertical I/O line intersection. While a square array is compact in relation to the number of ports it services, it may require a signal to travel through two pass transistors as it travels between ports. Pass transistors slow signal transit and increase signal degradation. In a triangular crosspoint array, hardwire connections between vertical and horizontal I/O lines replace switches along a main diagonal of the array and switches to one side of the diagonal are eliminated. Each interconnected horizontal and vertical pair of I/O lines services a separate port. A triangular crosspoint array makes relatively inefficient use of the surface area of an integrated circuit on which the device is formed since it services only half as many ports as a rectangular array of similar size. However the triangular crosspoint array routes signals between any two ports through only a single pass transistor. Thus triangular crosspoint arrays permit faster signal transit with less signal degradation.

A triangular crosspoint array, for example having 32 input/output ports, could be used to selectively interconnect bi-directional buses. One eight-bit bus from a computer could be connected to eight of the 32 ports while three eight-bit buses from peripheral devices could be connected to the other 24 input/output ports. The crosspoint array could then be configured to connect the computer to any selected one of the peripheral devices at any time. One disadvantage of using a conventional triangular crosspoint array to switch buses is the speed with which it can change signal routing. Data is written to one row of cells at a time and many clock cycles are needed to reconfigure switching patterns. Since the time required to reconfigure a crosspoint array can be relatively long, crosspoint arrays are not often used for bus switching.

What is needed is a large crosspoint array that requires minimal surface area of an integrated circuit, which routes signals between ports via only a single pass transistor, and which can rapidly switch busses connected to its ports.

SUMMARY OF THE INVENTION

In accordance with one aspect of the present invention, a folded hierarchical crosspoint array is formed from a set of switch cells implemented in an integrated circuit. Each switch cell occupies a separate rectangle in a common plane of the integrated circuit, each rectangle having opposing edges twice as long as their adjacent edges. The cells are arranged into square subarrays which, together with a set of control cells, form a compact square array providing the signal routing capability of a triangular crosspoint array.

Each cell includes orthogonal first and second I/O lines extending across the rectangle. A switch in each cell selectively provides a signal path between the first and second I/O lines. Each cell also includes a memory for storing a data bit, and includes orthogonal bit and word lines extending through the cell for delivering and write enabling the bit into the memory. A logic gate in each cell controls the switch in response to a combination of states of the bit in the memory and a control signal conveyed on a control line passing through the cell.

Each cell also contains a third I/O line extending through the cell parallel to the first I/O line. The cells are arranged so that the I/O lines of adjacent cells mate to form two orthogonal arrays of I/O lines extending across the crosspoint array. Pairs of orthogonal I/O lines are permanently interconnected within cells along a main diagonal of the crosspoint array to provide a set of I/O lines each extending through both the length and width of the crosspoint array. The I/O lines connect to input/output signal ports at the edges of the array. The arrangement of cells is such that any one port can be interconnected to any other port through the switch of only a single switching cell.

In accordance with another aspect of the invention, a control cell associated with each subarray of switch cells stores a data bit and provides the control signal to each cell of the associated subarray through their control lines. The control signal indicates the state of the bit stored in the control cell. When the bit stored in the control cell is in a logical true state, the switch cells of the subarray interconnect I/O signal paths in a pattern indicated by the data bits stored in the memories of the individual switching cells. When the bit stored in the control cell is false, the control signal inhibits all switch cells of the associated subarray from interconnecting I/O lines.

Like a conventional triangular crosspoint array, the "folded" crosspoint array of the present invention selectively routes signals between ports through only a single switch in each signal path. But the crosspoint array of the present invention has a densely packed, substantially square layout on an integrated circuit and requires less integrated circuit area than a conventional triangular crosspoint array. In addition, the logic gates in each cell and the control cells supplying control signals to logic gates in cells of associated switch cell subarrays provide a flexible, hierarchical form of switching control. By changing data stored only in the relatively few control cells rather than changing data stored in large numbers of switch cells, the hierarchical folded crosspoint array of the present invention can be made to switch connections between buses at its ports much more rapidly than a conventional triangular crosspoint array.

It is accordingly an object of the invention to provide an improved arrangement for a crosspoint array which provides the same signal routing capability of a conventional triangular crosspoint array but which requires a smaller area on an integrated circuit than a conventional triangular crosspoint array.

It is another object of the invention to provide an improved crosspoint array which can quickly change interconnections between buses connected to its ports.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 5A:
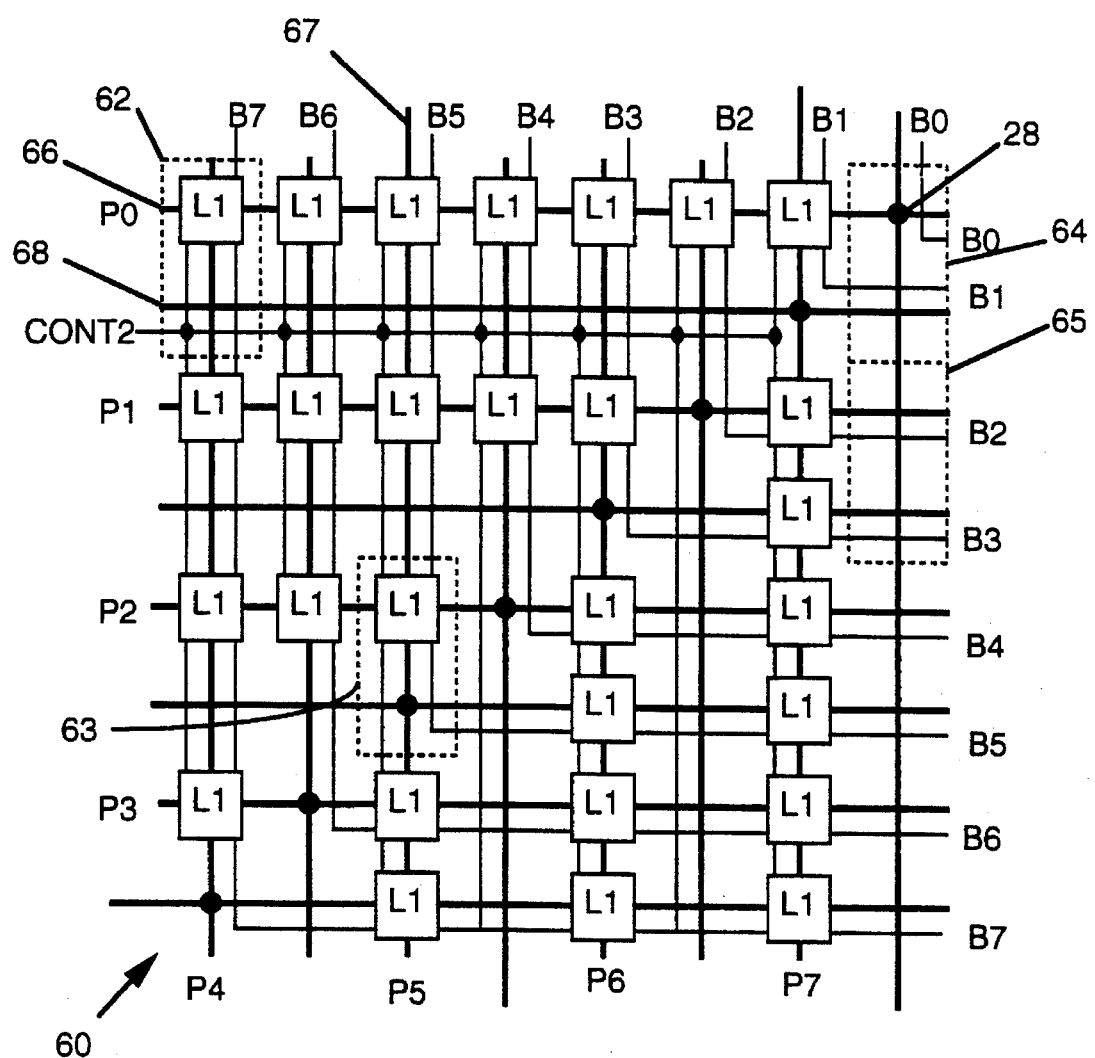
Figure 7A:
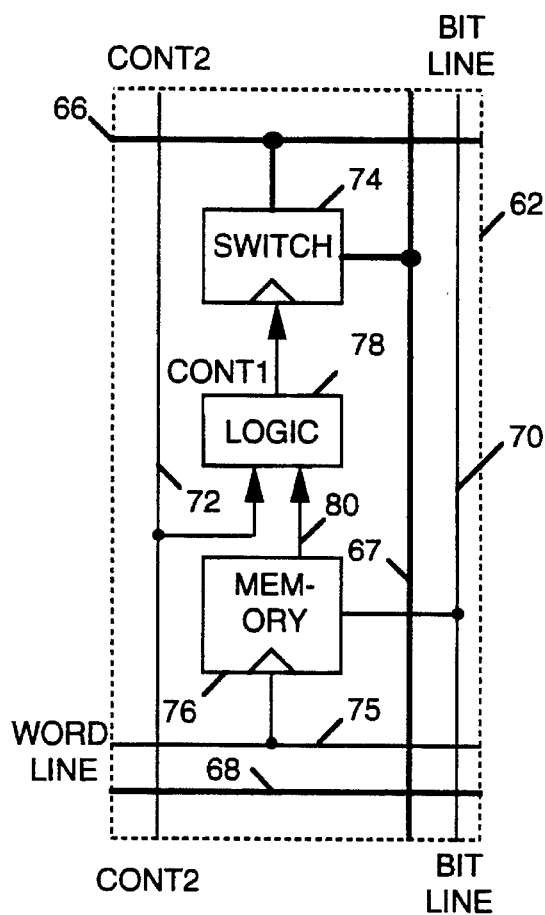
Figure 7B:
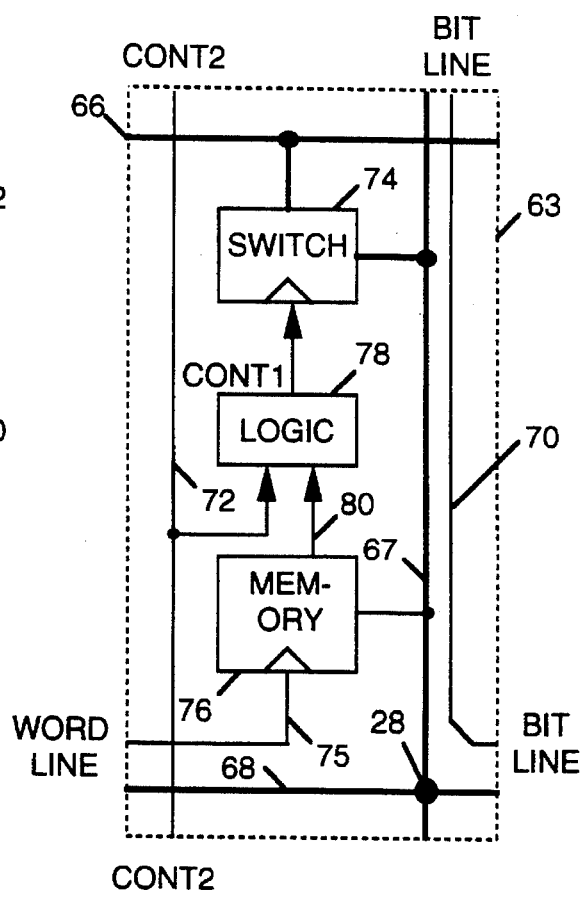
Figure 8:
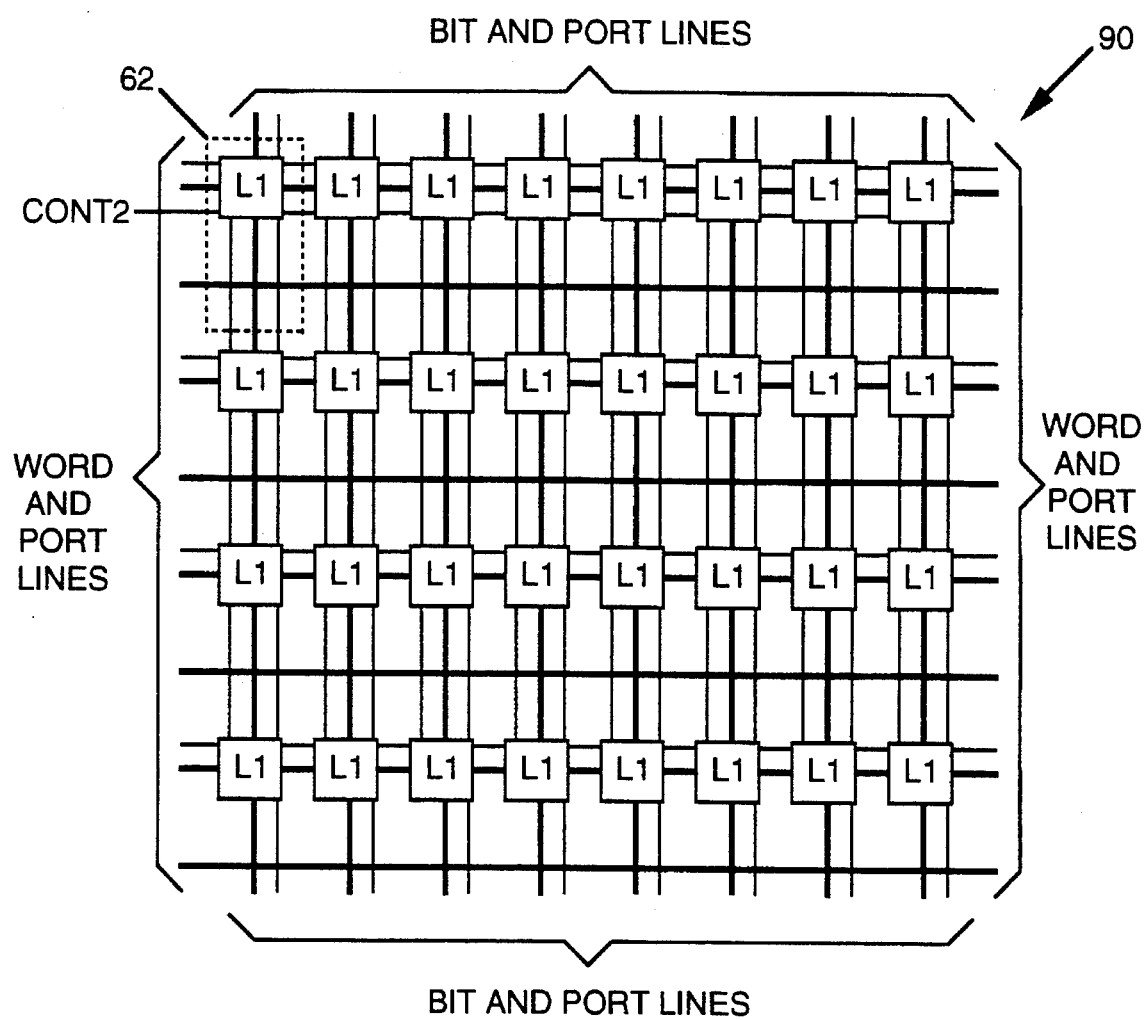
Figure 9:
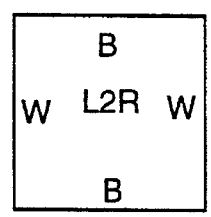
Figure 10:
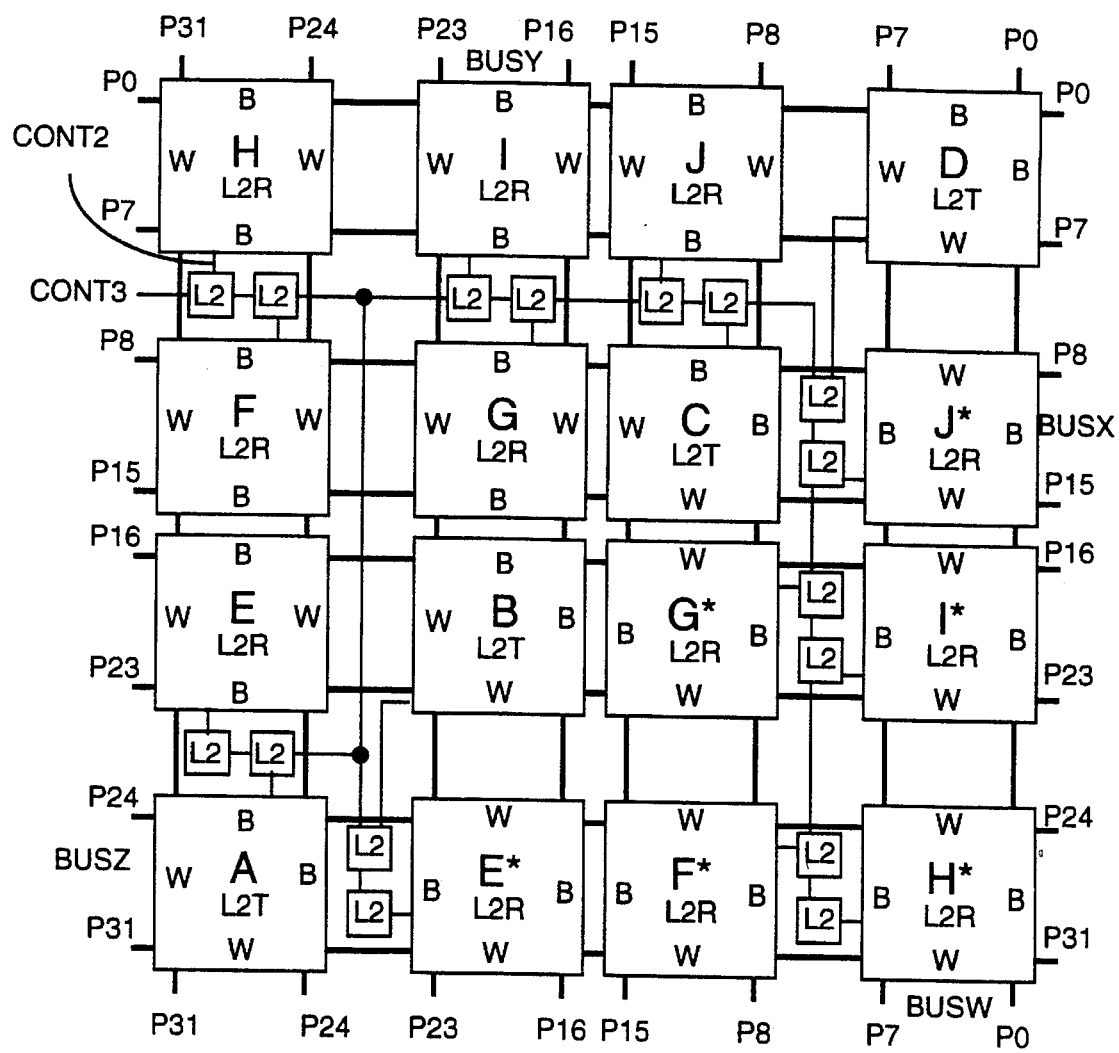
Figures 10A, 10B:
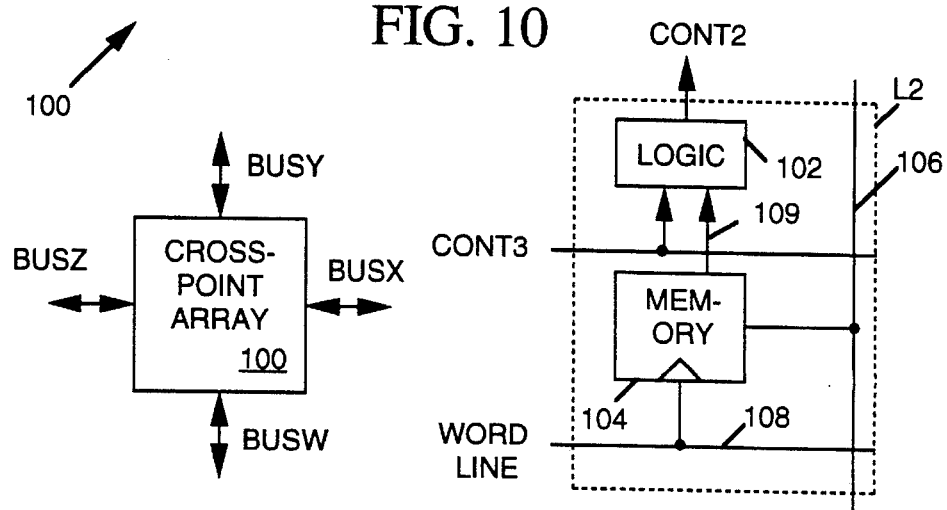
Figure 11:
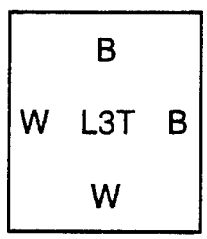
Figure 12:
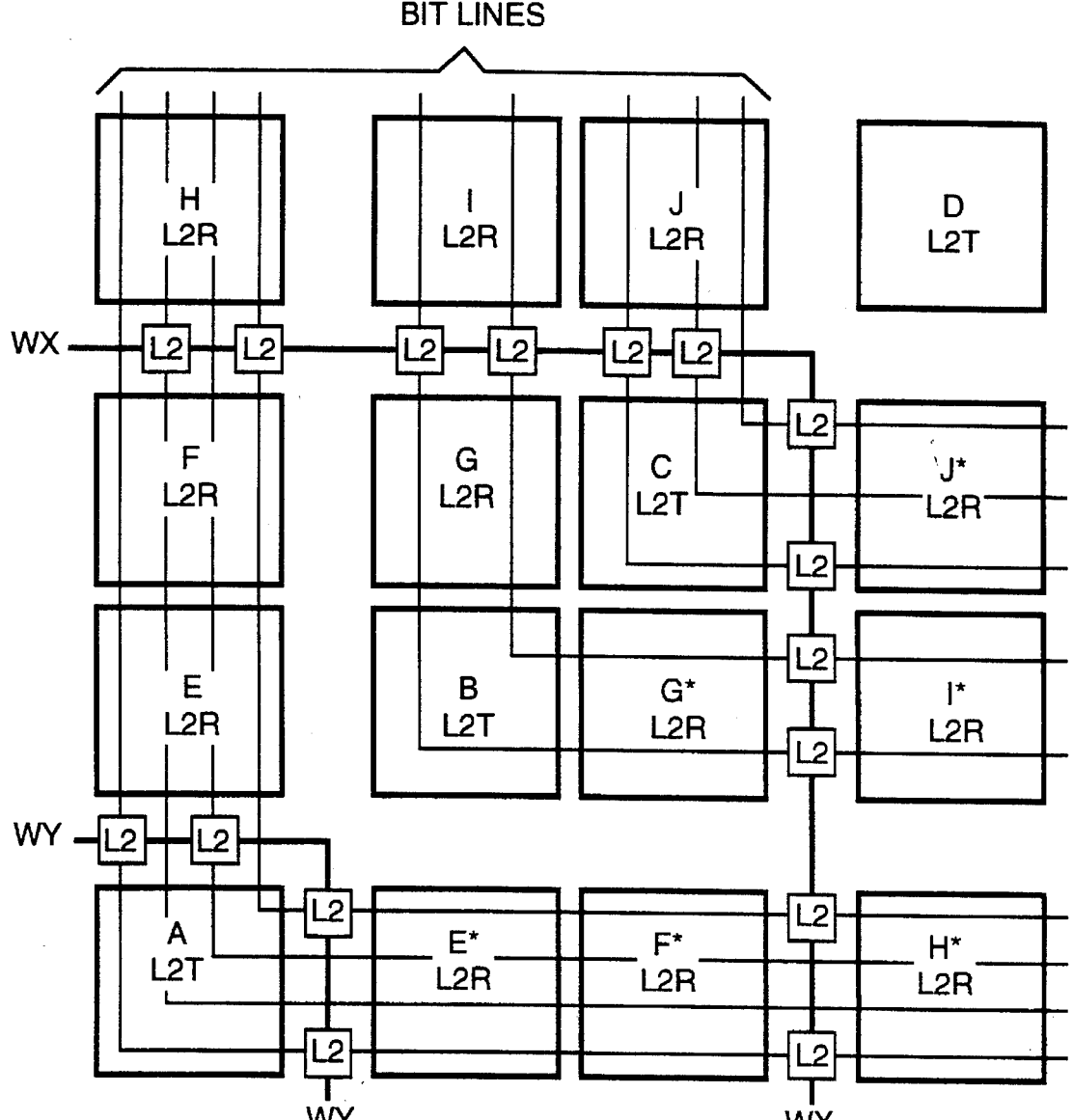
Figure 13:
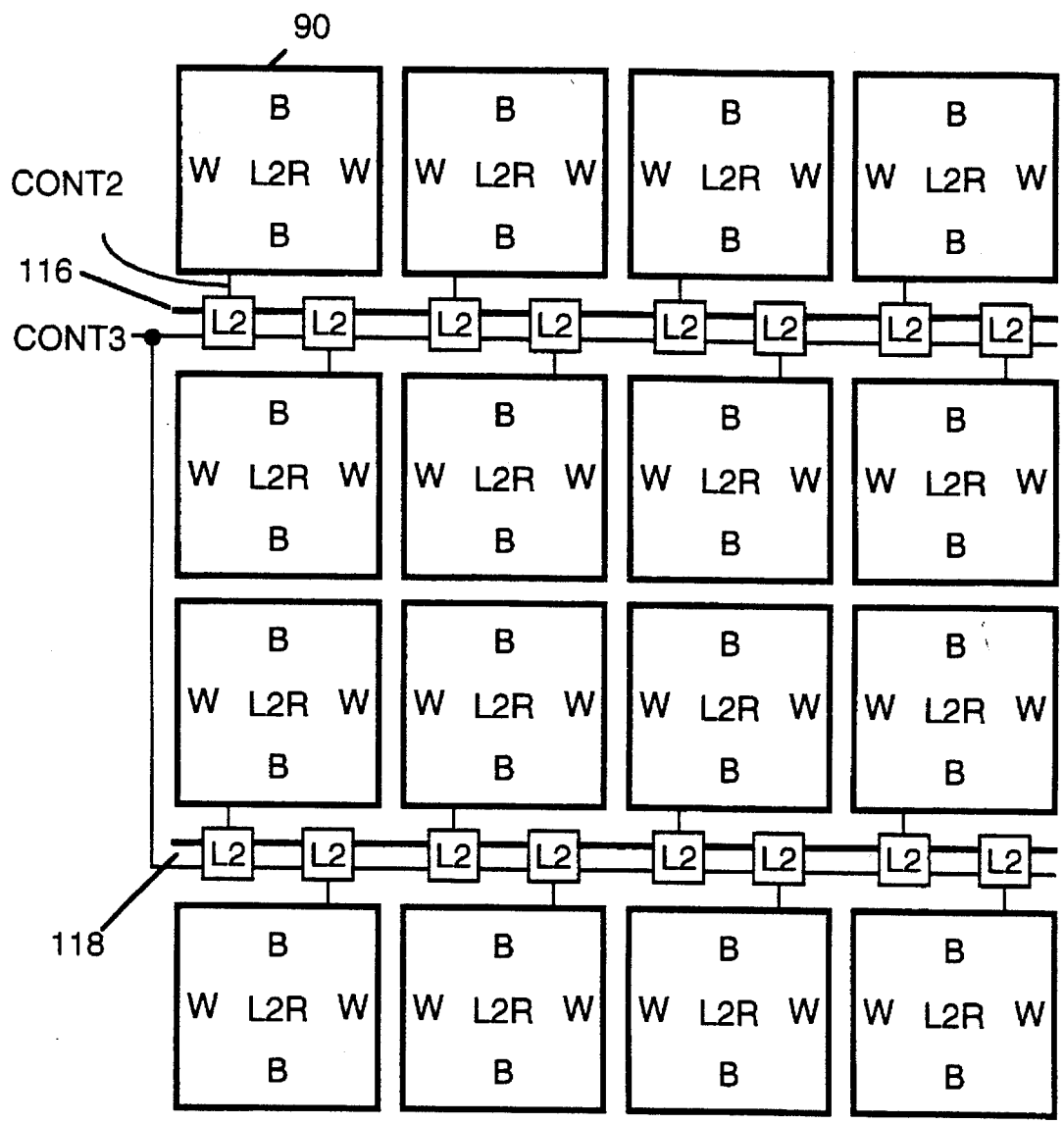
Figure 14:
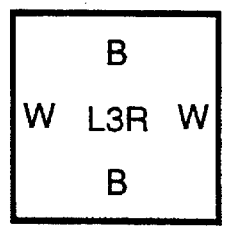
Figure 15:
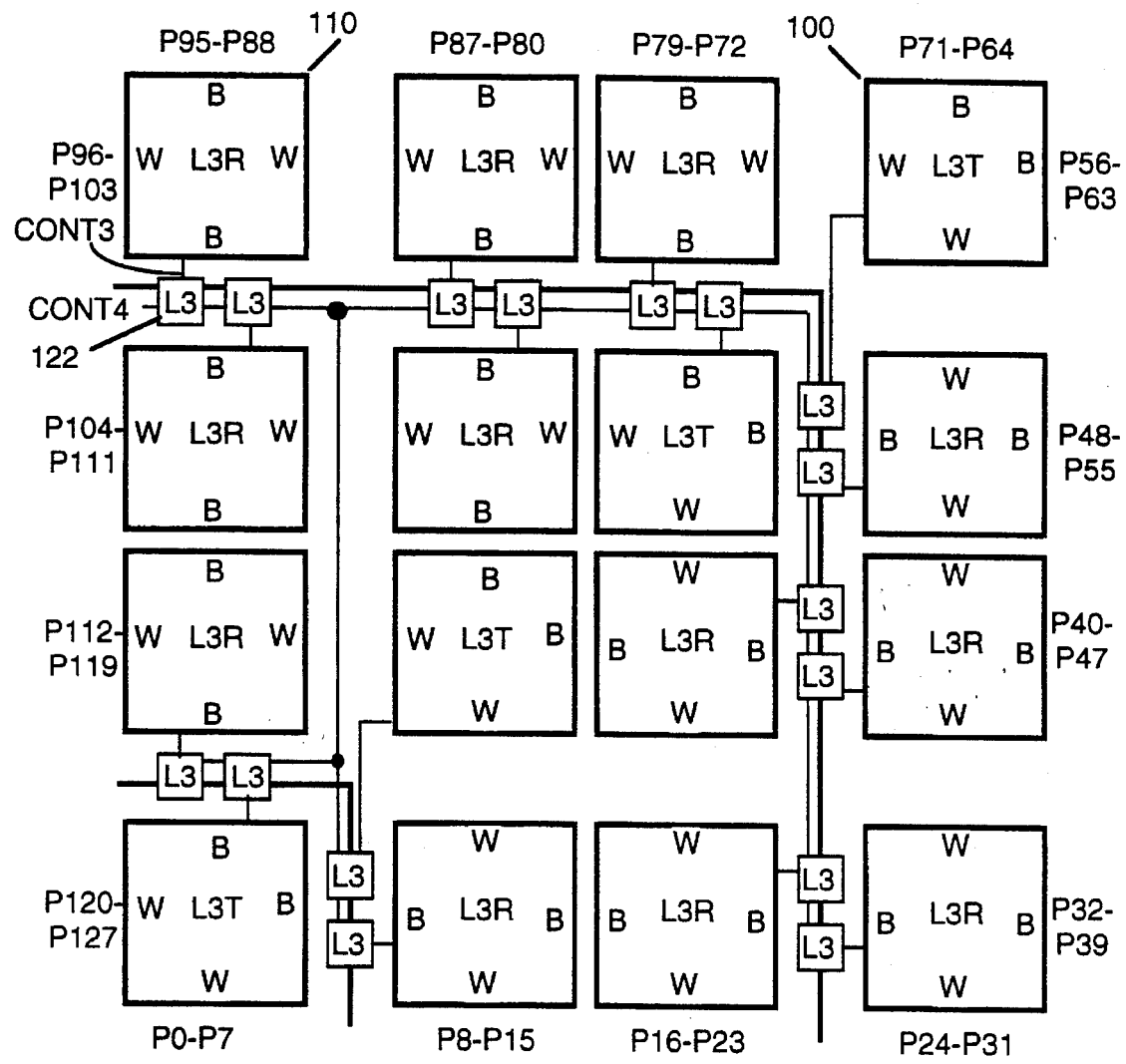

FIGS. 5A and 5B, when superimposed, form a block diagram of a two-level, folded triangular crosspoint array in accordance with the present invention;

FIG. 5C is a diagram representing an integrated circuit cell layout of the crosspoint array of FIGS. 5A and 5B;

FIG. 6 is a symbol depicting the folded triangular crosspoint array of FIGS. 5A and 5B;

FIGS. 7A and 7B are block diagrams of switch cells forming the crosspoint array of FIGS. 5A and 5B;

FIG. 8 is a two-level, 8 by 4 rectangular crosspoint array in accordance with the present invention;

FIG. 9 is a symbol depicting the rectangular crosspoint array of FIG. 8;

FIG. 10 is a block diagram of a three-level, folded crosspoint array formed by the two-level triangular and rectangular crosspoint arrays of FIGS. 5 and 8;

FIG. 10A is a block diagram depicting how buses may be connected to the crosspoint array of FIG. 10;

FIG. 10B is a block diagram illustrating a typical second level control cell of FIG. 10;

FIG. 11 is a symbol depicting the crosspoint array of FIG. 10;

FIG. 12 is a block diagram illustrating routing of selected word and bit lines through the crosspoint array of FIG. 10;

FIG. 13 is block diagram of a three-level folded, rectangular crosspoint array in accordance with the present invention;

FIG. 14 is a symbol depicting the three-level folded, rectangular crosspoint array of FIG. 13; and FIG. 15 is a block diagram illustrating a four-level crosspoint array in accordance with the present invention.

DESCRIPTION OF THE PREFERRED EMBODIMENT(S)

Figure 1:
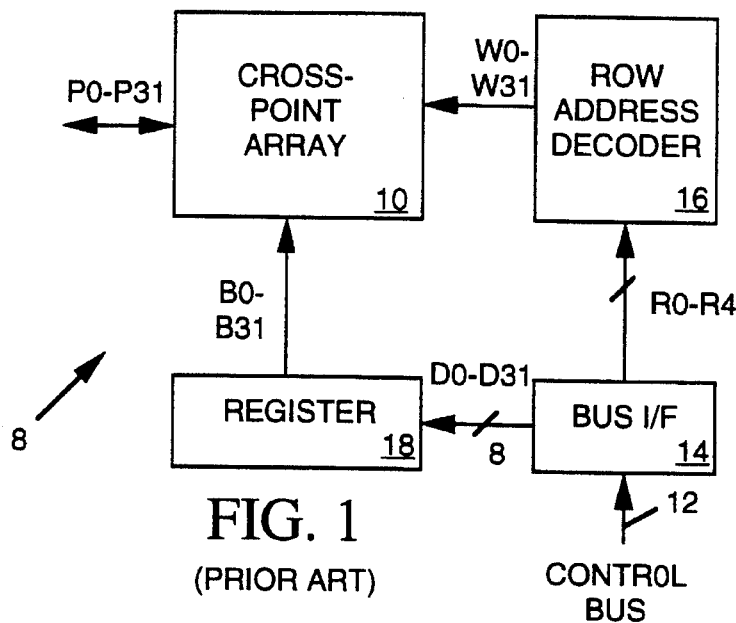
FIG. 1 is a block diagram of a prior art crosspoint switch.

FIG. 1 shows a prior art crossbar switch 8 utilizing a prior art crosspoint array 10 having thirty-two bi-directional ports P0–P31. Crosspoint array 10, programmed by data conveyed over a serial control bus 12, can connect any port P0–P31 to any other port P0–P31 so that signals may pass bi-directionally there between. The control bus 12 delivers programming data including a 5-bit row address R0–R4 and 32 -bit switch control data D0–D31 to a bus interface (I/F) circuit 14. Interface circuit 14 passes the row address to a row address decoder 16 and passes the switch control data to a register 18. Decoder 16 decodes the row address and asserts a selected one of 32 word lines W0–W31, thereby causing the crosspoint array 10 to acquire and store the switch control data from register 18 via bit lines B0–B31. Upon storing the control data, crosspoint array 10 makes various connections between ports P0–P31 as indicated by the stored control data.

Figure 2:
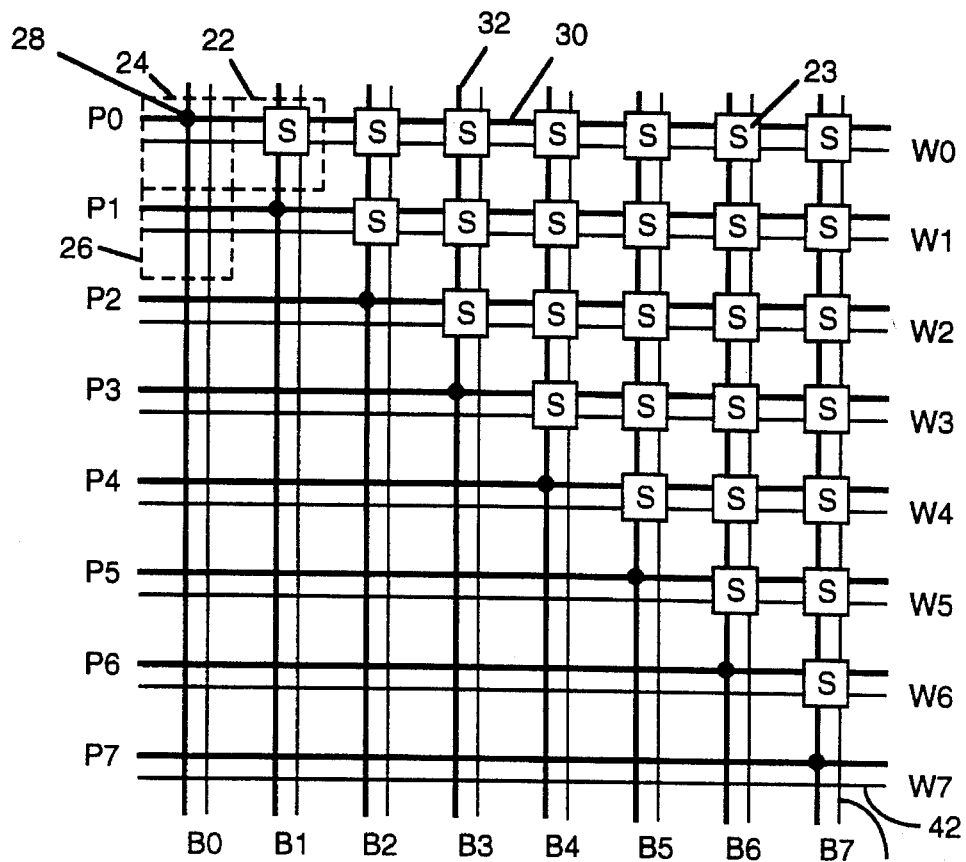
FIG. 2 is a block diagram of a prior art triangular crosspoint array.

FIG. 2 illustrates a prior art triangular crosspoint array 20 which forms a portion of crosspoint array 10 of FIG. 1. The crosspoint array 20 includes eight parallel first conductors (I/O lines) 30 and eight parallel second conductors (I/O lines) 32, orthogonal to the first conductors. A separate word line W0–W7 passes horizontally through the array adjacent to each I/O line 30 and a separate bit line B0–B7 passes vertically through the array adjacent to each I/O line 32. Pairs of I/O lines 30 and 32 are joined at nodes 28 along a main diagonal of array 20. Each interconnected pair of I/O lines 30, 32 conveys signals to or from a separate one of ports P0–P7. The crosspoint array 20, implemented on an integrated circuit, is made up of three different types of cells 22, 24 and 26. Each cell 22, 24, and 26 covers a square of similar area on the integrated circuit and crosspoint array 20 is an 8×8 square of cells 22, 24 and 26. Cell types 24 appear along the main diagonal of array 20 and include nodes 28 which permanently interconnect the horizontal and vertical I/O lines 30, 32 passing through the cell. Cell types 22 populate a triangular area above and to the right of the main diagonal and include switching circuits S for selectively interconnecting the I/O lines 30, 32 passing through the cell. Cell types 26 form a triangular area below and to the left of the main diagonal. Cell types 26 contain only conductors and do not include any switching circuits.

Figure 2A:
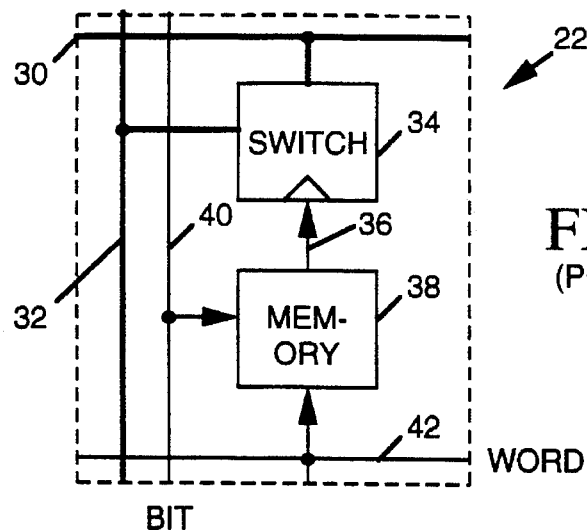
FIGS. 2A–2C are block diagrams of various types of cells forming the crosspoint array of FIG. 2.

FIG. 2A illustrates a typical prior art switching cell 22. Cell 22 includes a pair of I/O lines 30 and 32 extending across the cell in orthogonal directions. Each of these I/O lines convey signals to or from a separate one of ports P0–P31 of FIG. 1. Cell 22 also includes a bit line 40 (one of bit lines B0–B31 of FIG. 1) and a word line 42 (one of word lines W0–W31 of FIG. 1). Bit line 40 and word line 42 also extend across cell 22 in orthogonal directions. A switch 34 (suitably a pass transistor) connected to I/O lines 30 and 32 selectively provides a signal path between the two I/O lines in response to a control signal 36 produced by a single bit memory 38. Memory 38 stores a bit arriving on bit line 40 in response to a signal pulse on a word line 42. When the bit stored in memory 38 is true, the control signal 36 tells switch 34 to provide a signal path between I/O lines 30 and 32. When the bit stored in memory 38 is false, control signal 36 causes switch 34 to break the signal path between I/O lines 30 and 32.

Figure 2B:
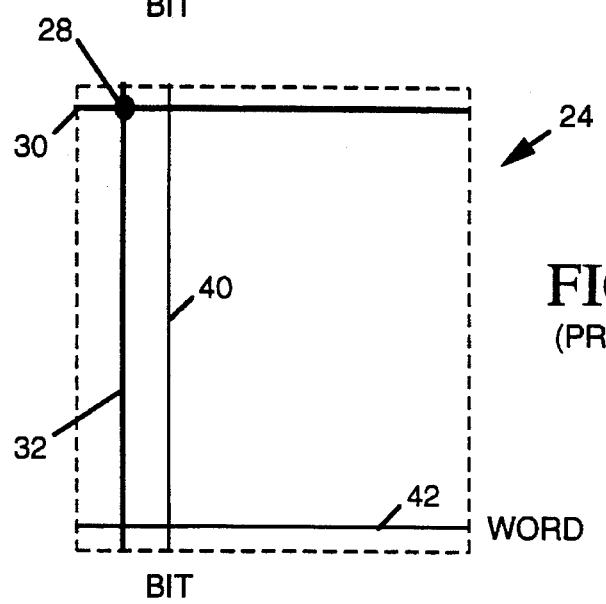

FIG. 2B illustrates a typical prior art cell 24. Cell 24 also includes I/O lines 30 and 32 extending across the cell in orthogonal directions and includes bit and word lines 40 and 42 also extending across cell 22 in orthogonal directions. However cell 24 has no switch or memory. I/O lines 30 and 32 are permanently interconnected at node 28.

Figure 2C:
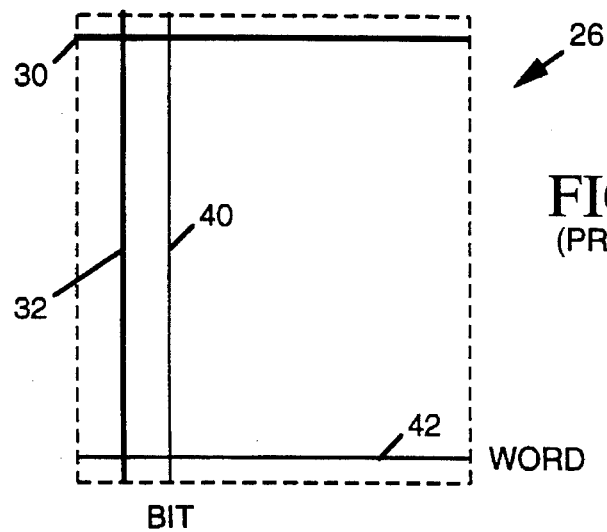

FIG. 2C illustrates a typical prior art cell 26. Cell 26 is similar to cell 24 of FIG. 2b except that I/O lines 30 and 32 are not interconnected at their intersection.

Referring again to FIG. 2, a signal arriving at any port P0–P7 passes both "horizontally" and "vertically" through the crosspoint array via I/O lines 30 and 32 since the horizontal I/O line 30 connected to the port is also connected to a vertical I/O line 32 along the main diagonal of the array. A signal arriving at any port P0–P7 can be routed to any other port by storing a true bit in the memory of the switching circuit S of only one switching cell 22. For example to route a signal from port P1 to port P6, a true bit is stored in the switch circuit S at the intersection of word line W1 and bit line B6.

Figure 3:
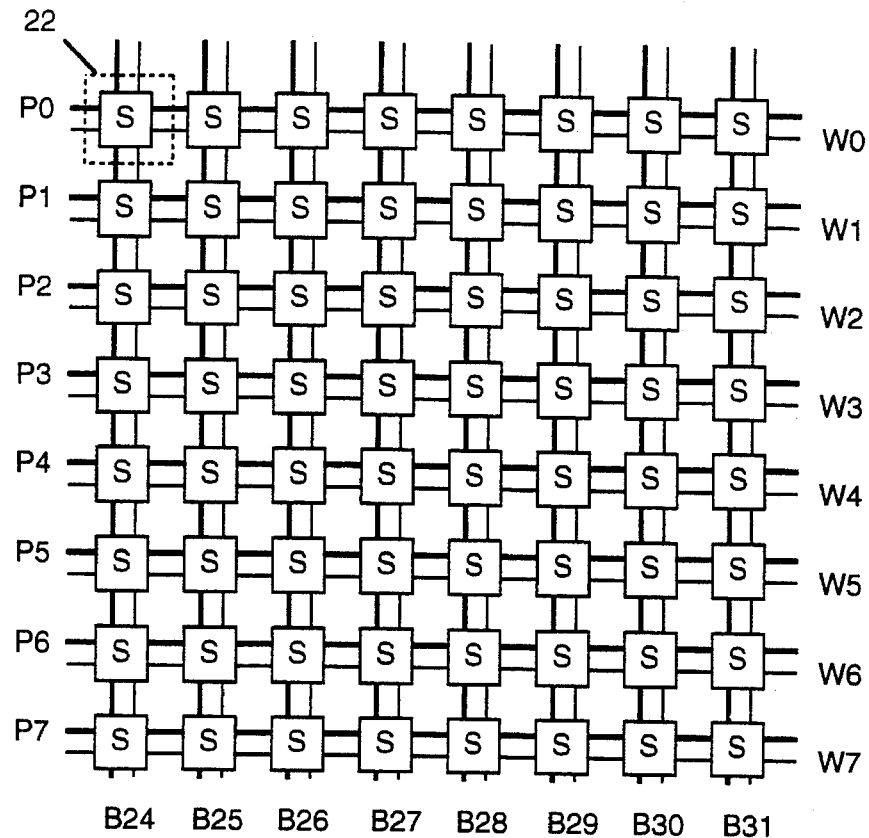
FIG. 3 is a block diagram of prior art rectangular crosspoint array.

FIG. 3 is a block diagram of a prior art square crosspoint array 50 forming another portion of crosspoint array 10 of FIG. 1. Array 50 consists entirely of an 8×8 array of cells 22 of FIG. 2A.

Figure 4:
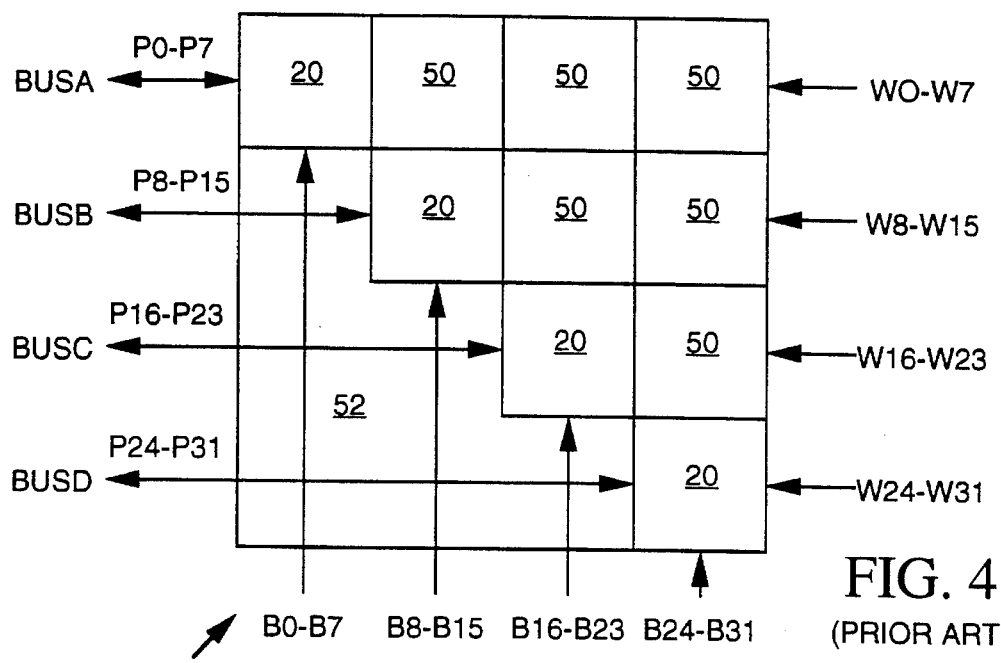
FIG. 4 is a block diagram of the integrated circuit layout of a prior art crosspoint switch formed by the triangular and rectangular crosspoint arrays of FIGS. 2 and 3.

FIG. 4 is a block diagram of the layout of prior art crosspoint array 10 of FIG. 1 as it appears on an integrated circuit. The crosspoint array 10 covers a rectangular area of the integrated circuit and includes triangular crosspoint arrays 20 of the type shown in FIG. 2 extending along its main diagonal and rectangular crosspoint arrays 50 of the type shown in FIG. 3 forming a triangular area to the right of the main diagonal. The remaining triangular portion 52 of switch 10 below the main diagonal consists of only bit line, word line, and port I/O line routing. Note that as it is laid out on an integrated circuit chip, about half of the chip space used by switch 10 is sparsely packed because it is used only for conductor routing and contains no circuit devices. Since so much of the chip is sparsely packed, crosspoint array 10 makes relatively inefficient use of integrated circuit space.

Prior art crosspoint array 10 could be used to selectively interconnect bi-directional buses connected to its ports. For example one eight bit bus BUSA from a computer could be connected to ports P0–P7 while three eight bit buses BUSB, BUSC and BUSD from peripheral devices could be connected to the other 24 input/output ports. The crosspoint array 10 could then be configured to connect the computer to any selected one of the peripheral devices at any time. One disadvantage of using the prior art crosspoint array 10 to switch buses is the speed with which it can change signal routing. Data is written to one row of cells at a time and many clock cycles of the control bus 12 of FIG. 1 are needed to reconfigure switching patterns. For example to disconnect BUSA at ports P0–P7 from BUSB at ports P8–P15 and reconnect BUSA to BUSC at ports P16–P23 requires at least 296 data cycles of control bus 12 of FIG. 1. To perform such a switching operation, control bus 12 must convey eight 32-bit D0–D31 data words, eight 5-bit R0–R4 row addresses, and various control bits. Since transmission of this amount of data takes a comparatively large amount of time, prior art crosspoint arrays are not often used to switch buses.

FIGS. 5A and 5B, when superimposed, form a block diagram illustrating the integrated circuit layout of a "folded, hierarchical, triangular" crosspoint array 60 in accordance with the present invention. Array 60 may be used as an 8 port crossbar switch. Array 60 uses the same number (28) of switch elements L1 as triangular crosspoint array 20 of FIG. 2 and provides the same routing capability of the prior art triangular crosspoint array 20 insofar as it can connect any port P0–P7 to any other port P0–P7 through only a single switch element. However the folded triangular crosspoint array is arranged differently so that it is more compact and consumes less space in an integrated circuit chip. Also the switch elements L1 of array 60 differ from switch elements S of array 20 in a way that makes array 60 suitable for use as a building block for a "hierarchical" crosspoint array. As discussed herein below, a hierarchical crosspoint array can more rapidly change interconnections between buses than a conventional triangular crosspoint array.

Array 60 of FIGS. 5A and 5B includes two sets of four "horizontal" I/O lines 66 and 68 and one set of eight "vertical" I/O lines 67. Pairs of I/O lines 66 and 67 or 67 and 68 are interconnected at nodes 28 where they intersect along a main diagonal. A set of bit lines B0–B7 enter the right side of array 60, turn 90 degrees near the main diagonal and then depart at the top of array 60. A set of four word lines W0, W2, W4, and W6 enter at the left of array 60 while a second set of four word lines W1, W3, W5 and W7 enter at the bottom of array 60. Crosspoint array 60 is made up of four basic types of cells 62–65. Switch connections between horizontal and vertical I/O lines are provided by "Level 1" switching circuits L1 included in cell types 62 and 63. A control line CONT2 is supplied to the switching circuits L1 in each cell 62 and 63. Note that the I/O ports, bit lines and control lines can be evenly distributed around the four sides of array 60.

FIG. 5C illustrates how the various cell types 62–65 are arranged in an integrated circuit. Cell type numbers marked with an asterisk (*). As formed in a common plane in an integrated circuit, cells 62–65 are all rectangular with substantially a 2/1 aspect ratio, each cell having two opposing sides that are substantially twice as long as their adjacent sides. However the crosspoint array 60 that they form is substantially square.

FIG. 6 symbolically depicts the folded, triangular crosspoint array 60 of FIGS. 5A and 5B. This symbol L2T is used when illustrating array 60 as a subarray building block for a larger crosspoint array. In FIG. 6, the symbol for array 60 is labeled "L2T" for "Level 2 Triangular". The "B's" and "W's" along the cell sides indicate where bit and word lines enter/depart the array.

FIG. 7A illustrates cell type 62. This cell includes three I/O lines 66, 67 and 68 for carrying signals between ports. I/O lines 66 and 68 extend across the cell in its narrower dimension while I/O line 67 extends across the cell in its wider dimension, orthogonal to I/O lines 66 and 68. Cell 62 also includes a bit line 70 extending across the cell in parallel with I/O line 67 and a word line 75 extending across the cell in parallel with I/O lines 66 and 68. Control line CONT2 crosses the cell in parallel with I/O line 67.

Like the prior art cell 22 of FIG. 2A, cell 62 includes a switch 74 to selectively interconnect orthogonally disposed I/O lines 66 and 67 and a memory 76 to store a single control bit conveyed on bit line 70 in response to a pulse on word line 75. However, unlike cell 22 of FIG. 2A, cell 62 includes a logic circuit 78 interposed between memory 76 and switch 74. Logic circuit 78, suitably an AND gate, receives the output signal 80 produced by memory 76 indicating the state of its stored bit. Logic circuit 78 also receives an externally generated control signal CONT2 and generates a logic signal CONT1 for controlling the operation of switch 74. When signal 80 indicates that the bit stored in memory 76 is true and control signal CONT2 conveys a true bit, logic circuit 78 signals switch 74 to create a signal path between I/O lines 66 and 67. However if the bit in memory 76 is false or if the bit conveyed by control signal CONT2 is false, logic circuit 78 signals switch 74 to break the signal path between I/O lines 66 and 67.

FIG. 7B illustrates cell type 63. This cell also includes three I/O lines 66, 67 and 68 for carrying signals between ports. Port lines 66 and 68 extend across the cell in its narrow dimension while I/O line 67 extends across the cell in its wider dimension, orthogonal to I/O lines 66 and 68. I/O lines 67 and 68 are permanently interconnected where they intersect at node 28. Cell 63 includes a bit line 70 providing data input to memory 76. Bit line 70 enters the right side of the cell, turns 90 degrees and then extends to the top of the cell. A word line 75 enters on the left side of the cell and terminates at memory 76. Control line CONT2 crosses the cell in parallel with I/O line 67 and also provides input to logic circuit 78. The memory, logic and switch circuits of FIG. 7B operate in a manner similar to those of FIG. 7A so as to provide selective control over interconnections between I/O lines 66 and 67.

FIG. 8 is a block diagram depicting a 4×8 rectangular crosspoint array 90 in accordance with the present invention. Array 90 may be used with the folded triangular array of FIGS. 5A and 5B as building block subarrays for constructing a larger crosspoint array. Array 60 is a 4×8 array of switching cells 62 of the type illustrated in FIG. 7A.

FIG. 9 symbolically depicts the folded rectangular crosspoint array 90 of FIGS. 5A and 5B. In FIG. 9, the symbol for array 90 is labeled "L2R" for "Level 2 Rectangular" and also marked with "B's" and "W's" on the cell sides where bit lines ("B") and word lines ("W") enter and depart the cell.

FIG. 10 is a block diagram of the integrated circuit layout of a three-level, hierarchical crosspoint array 100 in accordance with the present invention. Crosspoint array 100 may be used as a 32 port crosspoint switch. The three-level crosspoint array 100 includes a 4×4 array of Level 2 cells, where each Level 2 cell is either a triangular crosspoint array L2T similar to that shown in FIGS. 5A and 5B or a rectangular crosspoint array L2R similar to that shown in FIG. 8. The Level 2 triangular cells A–D are positioned along the main diagonal of the array while the Level 2 rectangular cells E through J and E* through J* comprise the remaining Level 2 cells of array 100. For simplicity, FIG. 10 shows only two of the eight I/O lines entering/leaving each edge of each Level 2 cell and shows none of the word and bit lines. The routing of bit and word lines through the array is indicated by the "W" and "B" labels on the edges of the Level 2 cell symbols. The I/O lines follow paths adjacent to the word lines. Note that the rectangular cells E*–J* are rotated 90 degrees from their "complement" rectangular cells H–J. Their corresponding control cells will also be addressed by the same word and bit lines.

In addition to the Level 2 switching cells of the type L2T and L2R, crosspoint switch 100 also includes a set of Level 2 control cells L2. Each of these Level 2 control cells L2 produces a separate Level 2 control signal CONT2 in response to an input Level 3 control signal CONT3 and a data bit stored in the control cell L2. The CONT2 signal from each control cell L2 is supplied in parallel to every first level switching cell within a corresponding second level switching cell L2R or L2T.

Referring again to FIGS. 7A and 7B illustrating individual first level switching cells, the CONT2 signal is supplied to logic circuit 78. When that signal is false, logic circuit 78 inhibits switch 74 from interconnecting I/O lines 66 and 67 even when the bit in memory 76 otherwise indicates the switch should connect the I/O lines.

Referring back to FIG. 10, when bits in all Level 2 control cells L2 are true, crosspoint array 100 acts like a conventional 32 port triangular crosspoint array insofar as it can selectively interconnect any two of its 32 ports through only a single switch cell. The connections are controlled entirely by the data stored within the individual Level 1 switching cells within each Level 2 crosspoint array L2T or L2R and their compliments. However by selectively setting data bits stored in second level control cells L2 false, the I/O line interconnection activity of entire second level subarrays L2T or L2R and their compliments can be inhibited regardless of the data stored in the memories of their first level switching cells L1. Thus while the data stored in the memory of an individual first level switching cell L1 within each subarray L2R or L2T and their compliments can determine whether or not two individual ports are interconnected, the data bit stored in a second level control cell L2 may be used to concurrently control switch operation of all first level cells within a corresponding second level array L2T or L2R and their compliments. Level 2 control cells L2 thus provide a second level of control over switching activity of the hierarchical crosspoint array 100.

The crosspoint array 100 of FIG. 10 is particularly suited to rapidly switching connections between a set of eight-bit buses. For example as illustrated in FIG. 10A, assume an eight bit computer BUSW is connected to ports P0–P7 along the bottom of array 100 and eight bit buses BUSX, BUSY and BUSZ from three different peripheral devices were connected to ports P8–P15, P16–P23, and P24–p31, respectively, along the three remaining sides of array 100. Assume BUSW is initially connected to BUSZ through Level 1 cells within Level 2 subarrays H and H*. We could switch BUSZ from BUSW to BUSX by first changing the data stored in the memories of Level 1 switching cells within subarrays H and H* to disconnect BUSW from BUSZ. We could then change data in the Level 1 cells within Level 2 subarrays F and F* to connect BUSX to BUSZ. However changing data in so many Level 1 switching cells would require much time, particularly when this control data must pass through a serial bus on the way to the crosspoint array.

On the other hand, suppose first level memories within second level subarrays H and H* were initially programmed to connect BUSW to BUSZ and memories of Level 1 switching cells within Level 2 subarrays F and F* were initially programmed to connect BUSX to BUSZ. If data stored in Level 2 control cells L2 initially inhibited switching activity of all second level subarrays except subarrays H and H*, BUSW would initially be connected to BUSZ. Even though the other Level 2 subarrays are programmed to connect BUSW to BUSX and BUSY, false data bits in the second level control cells L2 inhibits them from actually doing so. To switch BUSZ from BUSW to BUSX, we need only change the four data bits stored in the Level 2 control cells L2 which control the four second level subarrays H, H*, F and F*. We can thereafter switch BUSZ from BUSW to BUSX or back to BUSW with the same speed simply by changing the data stored in only a relatively few second level control cells L2.

Note that since subarrays and their complements (e.g. H and H*) are always switched simultaneously, we can assign their control cells the same word/bit address, thereby further reducing switching time. Thus the hierarchical crosspoint array 100 of FIG. 10 can be used to rapidly switch buses by first storing data indicating the various bus switching patterns in the Level 1 switching cells and then using the Level 2 control cells to select from among those predetermined patterns.

FIG. 10B is a block diagram illustrating a typical second level control cell L2 of FIG. 10. Cell L2 includes a single bit memory 104 and a logic circuit 102, suitably an AND gate. Memory 104 stores a bit on a bit line 106 in response to a pulse on word line 108 and produces an output signal 109 indicating the state of the stored bit. Logic circuit 102 receives output signal 109 and also receives an externally generated control signal CONT3. If the bit stored in memory 104 is true, and if the CONT3 signal is true, logic circuit 102 produces an output CONT2 signal of true state. If the bit stored in memory 104 is false or if the CONT3 signal is false, then logic circuit 102 sets CONT2 false.

Referring again to FIG. 10, the CONT3 signal is an externally generated signal that is supplied in parallel to every level 2 control cell L2. Thus if the CONT3 signal is false, all of the second level cells of array 100 are inhibited from interconnecting ports P0–P31. Thus the Level 3 switching array 100 of FIG. 10 has three levels of switching control. The first level of control is providedby the data stored in the memories of the first level (L1) switching cells within each second level array L2R or L2T. The second level of control is providedby the data stored in the memories of the Level 2 control cells L2. If the CONT2 signal produced by a Level 2 control cell L2 is false, then the associated level 2 switching cell makes no interconnections regardless of the state of control bits stored in Level 1 switching cells L1 therein. The third level of control is provided by the externally generated CONT3 signal. If that signal is false, the entire array 100 is inhibited from interconnecting any of the ports P0–P31 regardless of the state of data in the Level 1 and Level 2 switch and control cells.

The three-level array 100 can be used as a building block subarray in a higher level folded crosspoint array. FIG. 11 is a symbol L3T for depicting the level three triangular crosspoint array 100 FIG. 10 when illustrating its use in a higher level array.

FIG. 12 is a block diagram illustrating routing of selected word and bit lines through the second level control cells L2 of the crosspoint array 100 of FIG. 10. For simplicity, the I/O lines, word lines, control lines and most of the bit lines for the Level 1 switch cells of L2R and L2T are not shown. The second level control cells L2 require only 2 additional word lines WX and WY for controlling storage of data therein. Word line WX passes through Level 2 control cells L2 associated with second level switching cells C and D as well as second level cells F, G, H, I, and J and their "complement" cells F*, G*, H*, I*, and J*. Word line WY accesses cells A, B, E and E*. The second level control cells L2 do not require additional bit lines but instead share bit lines servicing various Level 1 switching cells within adjacent Level 2 switch cell subarrays.

Note that the word lines WX and WY and bit lines turn 90 degrees along the main diagonal of crosspoint 100 and that word and bit lines can intersect each other at two locations. The Level 2 rectangular switching cells type L2R are 4×8 cells. In order to switch 8-bit blocks, it is helpful to enable and disable the second level rectangular switching cells and their complements concurrently in pairs. Accordingly each second level rectangular switching cell E–J shares the same bit and word lines with its complement rectangular cell E*–J*. Thus the same bit is stored in the Level 2 control cell L2 for each switching cell E–J as is stored in the control cell for its complement E*–J*. The switching operations of each second level cell and its compliment are therefore always concurrently enabled or disabled.

The crosspoint array 100 of FIG. 12 may be used in connection with a crossbar switch system similar to system 8 of FIG. 1. However row address decoder 16 of FIG. 1 must control two additional word lines WX and WY provided to the second level control cells L2 and bus interface circuit 14 must supply an additional row address bit to decoder 16. Also ports P0 and P31 would be distributed evenly (bytewise) around the crosspoint array, the bit lines would be distributed evenly over the top and right sides as if FIG. 5A, and the word lines would be distributed evenly over the left and bottom sides of the crosspoint array as in FIG. 5B. The even distribution of I/O ports in the crosspoint array 100 of FIG. 10 allows external circuitry such as I/O port buffers to be located more closely to the ports than in the prior art crosspoint array 10 of FIG. 4 where the I/O ports are congregated along one side of the array.

FIG. 13 is block diagram of the integrated circuit layout of a Level 3 folded, rectangular crosspoint array 110 in accordance with the present invention. Array 110 includes a 4×4 array of Level 2, folded rectangular crosspoint arrays 90 of the type illustrated in FIG. 8. For each second level switching cell 90 there is a second level control cell L2 of the type illustrated in FIG. 10B supplying a CONT2 signal to the second level cell 90. There are two rows of such second level control cells L2 and each row receives its own word line 116 or 118. Each second level control cell L2 receives one of the bit lines (not shown) passing through the second level switching cell 90 that it controls. All of the second level control cells L2 receive the same third level control signal CONT3.

FIG. 14 is a symbol L3R depicting the level 3 rectangular crosspoint array of FIG. 13. As discussed herein below, we can use the folded triangular crosspoint array 100 of FIG. 12 and rectangular crosspoint array 110 of FIG. 13 as subarray cells to build a four-level crosspoint array.

FIG. 15 is a block diagram of the integrated circuit layout of a four-level, folded, hierarchical crosspoint array 120 in accordance with the present invention which may be used as a 128 port crossbar switch. Array 120 includes a 4×4 array of three- level cells, where each third level cell is either a triangular crosspoint array 100 similar to that shown in FIG. 10 or a rectangular crosspoint array 110 similar to that shown in FIG. 14. Crosspoint array 120 also includes a set of Level 3 control cells L3 each providing a CONT control signal 124 to a corresponding third level crosspoint array L3R or L3T. The arrangement of third level cells in the four-level array 120 of FIG. 15 is similar to the arrangement of second level cells in the three-level array 100 of FIG. 10. Array 120 can be used for rapidly switching, for example 8-bit, 32-bit or 128-bit buses connected to its ports by loading data into the Level 1 switching cells defining the desired switching patterns and by using the appropriate level control cells to select the desired swathing pattern.

As has been illustrated herein, a Level 2 hierarchical crosspoint array such as array 60 of FIGS. 5A and 5B has eight I/O ports, 2 on each side, a Level 3 crosspoint array such as array 100 of FIG. 10 has 32 I/O ports, 8 on each side, and a Level 4 crosspoint array such as array 120 of FIG. 15 has 128 ports, 32 ports per side. From the foregoing discussion it should be apparent to those skilled in the art that successively larger, higher order, folded hierarchical crosspoint arrays can be constructed in a similar manner. Instead of expanding each level by a factor of four, a similar principle can be used to expand each level by a factor of 2. An N level crosspoint array can service $2^{N-1}$ or $4^{N-1}$ input/output ports. The ability to construct a folded hierarchical crosspoint array stems largely from the physical arrangement of the Level 1 Switching cells as illustrated in FIGS. 7A and 7B which, together with control cells similar to those illustrated in FIG. 10B, make up the primary building blocks of the folded, hierarchical array.

While the forgoing specification has described preferred embodiment(s) of the present invention, one skilled in the art may make many modifications to the preferred embodiment without departing form the invention in its broader aspects. The appended claims therefore are intended to cover all such modifications as fall within the true scope and spirit of the invention.

We claim:

1. A crosspoint array comprising:

means for generating a control signal;

a plurality of switch cells, each cell occupying a separate rectangle in a common plane of an integrated circuit, said rectangle having parallel first edges and adjacent second edges, said first edges being substantially longer than said second edges, each cell comprising a first conductor extending between said first edges of said rectangle, a second conductor extending between said second edges of said rectangle, first memory means for storing a first data bit and producing an output signal indicating a state of said stored first data bit, logic means receiving said output signal and receiving said control signal for producing a logic signal in response to a logical combination of states of said output signal and said logic signal, and switch means coupled to said first and second conductors and receiving said logic signal for selectively providing a signal path between said first and second conductors in response to said logic signal.

2. The crosspoint array in accordance with claim 1 wherein said cells abut one another to form substantially a square in said common plane.

3. The crosspoint array in accordance with claim 1 wherein said first edges are substantially twice as long as said second edges.

4. The crosspoint array in accordance with claim 1 wherein said means for generating a control signal comprises:

means for generating a second control signal;

second memory means implemented within said integrated circuit for storing a second data bit and producing a second output signal of state indicating a state of said stored second data bit; and second logic means receiving said second output signal and said second control for producing said control signal of state indicating a logical combination of states of said second output signal and said second control signal.

5. The crosspoint array in accordance with claim 1 wherein said cells are arranged such that the first conductor of at least one of said cells contacts a second conductor of another of said cells.

6. The crosspoint array in accordance with claim 1 wherein each said cell further comprises a third conductor parallel to said first and second conductors extending between said opposing edges of said rectangle.

7. The crosspoint array in accordance with claim 1 wherein said cells are arranged such first edges of ones of said cells are orthogonal to first edges of others of said cells.

8. A crosspoint array comprising:

a plurality of switch cells, each cell occupying a separate rectangle in a common plane of an integrated circuit, said rectangle having first edges and second edges, said first edges being substantially twice as long as said second edges, said cells abutting one another to form substantially a square in said common plane, each cell comprising a first conductor extending between said first edges of said rectangle, a second conductor extending between said second edges of said rectangle, first memory means for storing a first data bit and producing an output signal indicating a state of said stored first data bit, logic means coupled to said first memory means for receiving said output signal and receiving a control signal for producing a logic signal in response to a logical combination of states of said output signal and said control signal, and switch means coupled to said logic means for receiving said logic signal and coupled to said first and second conductors for selectively providing a signal path between said first and second conductors in response to said logic signal;

control means implemented within said integrated circuit for storing a second data bit and producing said control signal indicating a state of said stored second data bit; and means for conveying said control signal to said logic means of each cell.

9. The crosspoint array in accordance with claim 8 wherein said cells are arranged such that first edges of ones of said cells abut second edges of others of said cells and such that the first conductor of said ones of said cells contacts a second conductor of said others of said cells.

10. The crosspoint array in accordance with claim 8 wherein each said cell further comprises a third conductor extending between said opposing first edges of said rectangle, the cells being juxtaposed such that the third conductor of ones of said cells contact the second conductor of others of said cells.

\* \* \* \* \*

UNITED STATES PATENT AND TRADEMARK OFFICE
CERTIFICATE OF CORRECTION

PATENT NO.  : 5,559,971
DATED       : September 24, 1996
INVENTOR(S) : Wen-Jai HSIEH et al It is certified that error appears in the above-identified patent and that said Letters Patent is hereby corrected as shown below:

On Title page, left column, between item [73] and item [21] insert:

[*] Notice:    The term of this patent shall not extend beyond the expiration date of Pat. No. 5,465,056.

left column, item [21] should read:

Filed:  Nov. 2, 1994 right column, item [45] should read:

Date of Patent:  *Sep. 24, 1996

Signed and Sealed this

Twenty-eighth Day of January, 1997

Attest:

BRUCE LEHMAN

Attesting Officer    Commissioner of Patents and Trademarks